(12) United States Patent
Han

(10) Patent No.: US 7,544,530 B2
(45) Date of Patent: Jun. 9, 2009

(54) CMOS IMAGE SENSOR AND MANUFACTURING METHOD THEREOF

(75) Inventor: Chang Hun Han, Icheon-si (KR)

(73) Assignee: Dongbu Electronics Co., Ltd. (KR)

( * ) Notice: Subject to any disclaimer, the term of this patent is extended or adjusted under 35 U.S.C. 154(b) by 216 days.

(21) Appl. No.: 11/486,456

(22) Filed: Jul. 13, 2006

(65) Prior Publication Data

US 2007/0012963 A1  Jan. 18, 2007

(30) Foreign Application Priority Data

Jul. 14, 2005   (KR) .................. 10-2005-0063732

(51) Int. Cl.
    *H01L 21/20* (2006.01)
(52) U.S. Cl. .............................. 438/48; 438/59; 438/63; 438/197; 438/234; 257/E21.001; 257/E21.696; 257/E27.131; 257/E27.132; 257/E27.133
(58) Field of Classification Search ......... 257/292–293, 257/E21.001, 696, E27.131, 132, 133, 152; 438/199, 48, 59, 63, 234
    See application file for complete search history.

(56) References Cited

U.S. PATENT DOCUMENTS

| | | | | |
|---|---|---|---|---|
| 5,106,765 | A * | 4/1992 | Mizutani et al. ............... | 438/59 |
| 6,166,405 | A | 12/2000 | Kuriyama et al. | |
| 6,228,674 | B1 * | 5/2001 | Pan .............................. | 438/63 |
| 7,388,241 | B2 * | 6/2008 | Rhodes ........................ | 257/292 |
| 2004/0021060 | A1 * | 2/2004 | Ohkawa .................... | 250/214.1 |
| 2006/0273355 | A1 * | 12/2006 | Han ............................ | 257/239 |
| 2006/0273360 | A1 * | 12/2006 | Jeon ............................ | 257/291 |
| 2006/0284223 | A1 * | 12/2006 | Kim ............................ | 257/292 |
| 2008/0157138 | A1 * | 7/2008 | Lee ............................. | 257/292 |

OTHER PUBLICATIONS

People's Republic of China Office Action; Application No. 2006-10098796.4; Dated: Dec. 7, 2007; State Intellectual Property Office of People's Republic of China; People's Republic of China.

* cited by examiner

*Primary Examiner*—Michael S Lebentritt
(74) *Attorney, Agent, or Firm*—Andrew D. Fortney

(57) ABSTRACT

Disclosed are a CMOS image sensor and a manufacturing method thereof. The method includes the steps of: forming an isolation layer on a semiconductor substrate, defining an active region that includes a photo diode region and a transistor region; forming a gate in the transistor region, the gate including a gate electrode and a gate insulating layer; forming a first low-concentration diffusion region in the photo diode region; forming a second low-concentration diffusion region in the transistor region; forming a buffer layer over the substrate, the buffer layer covering the photo diode region; forming first and second insulating layers over the entire surface of the substrate, the first and second insulating layer having a different etching selectivity from each other; forming an insulating sidewall on sides of the gate electrode by selective removal of the second insulating layer; removing the first insulating layer from the transistor region; forming a high-concentration diffusion region in the exposed transistor region, partially overlapping the second low-concentration diffusion region; and forming a metal silicide layer on the high-concentration diffusion region.

14 Claims, 11 Drawing Sheets

CMOS IMAGE SENSOR AND MANUFACTURING METHOD THEREOF

BACKGROUND OF THE INVENTION

1. Field of the Invention

The present invention relates to a semiconductor device and manufacturing method thereof. More specifically, the present invention relates to a complementary metal oxide semiconductor (CMOS) image sensor and manufacturing method thereof.

2. Description of the Related Art

An image sensor, as a kind of semiconductor device, transforms optical images into electrical signals. Image sensors can be generally classified into charge coupled devices (CCD) and CMOS image sensors.

Conventionally, a CCD comprises a plurality of photo diodes arranged in the form of matrix to transform optical signals into electrical signals, a plurality of vertical charge coupled devices (VCCDs) formed between the photo diodes to transmit charges generating in each photo diode in a vertical direction, a plurality of horizontal charge coupled devices (HCCDs) for transmitting charges transmitted from each VCCDs in a horizontal direction, and a sense amplifier for sensing charges transmitted in the horizontal direction to output electrical signals.

It has been generally known that CCDs have relatively complicated operational mechanisms, and high power consumption. In addition, its manufacturing method is relatively complicated, because multiple photolithography processes are required in its fabrication. Especially, it is difficult to integrate a CCD with other devices such as control circuits, signal processing circuits, analog/digital converters, etc., in a single chip. Such disadvantages of CCDs may hinder miniaturization of products containing a CCD.

In order to overcome above described disadvantages of CCDs, CMOS image sensors have been recently developed in the oncoming generation(s) of image sensors.

Meanwhile, CMOS image sensors can be classified into 3T, 4T, 5T types, etc., according to the number of transistors in a unit pixel. The 3T type CMOS image sensor comprises one photo diode and three transistors in the unit pixel, and the 4T type comprises one photo diode and four transistors in the unit pixel. Here, a unit pixel layout of the 3T type CMOS image sensor is configured as follows.

FIG. 1 shows a layout illustrating unit pixel in a conventional 3T type CMOS image sensor.

As shown in FIG. 1, one photo diode 20 is formed in a large portion of a defined active region 10, and three transistors 120, 130, and 140 are respectively formed to overlap other portions of the active region 10. The transistor 120 constitutes a reset transistor, and the transistor 130 constitutes a driver transistor, and the transistor 140 constitutes a select transistor. Here, dopant ions are implanted in the active region 10 where each transistor is formed, except the portion of active region 10 below each gate electrode of the transistors 120, 130, and 140, to form source and drain regions of each transistor.

A supply voltage (VDD) is applied to source/drain regions between the reset transistor and the driver transistor, and the source/drain regions formed at one side of the select transistor is connected to detecting circuits (not shown). Transistors 120, 130, and 140 are respectively connected to signal lines, even though they are not illustrated in FIG. 1. In addition, signal lines are respectively connected to external driving circuits via additional pads respectively formed at one end thereof.

FIG. 2 shows a cross-sectional view illustrating a photo diode and a reset transistor of a conventional CMOS image sensor, in view of A-A' line in FIG. 1.

Referring to FIG. 2, P− type epitaxial layer 101 is formed on a P++ type semiconductor substrate 100. In addition, the semiconductor substrate 100 including the epitaxial layer 101 is defined by the active region 10 including the photo diode region PD, as shown in FIG. 1, and an isolation region where isolation layer 102 is formed.

As shown in FIG. 2, the gate electrode 104 for the reset transistor 120 is formed on the epitaxial layer 101 and on a gate insulating layer 103. Nitride sidewalls 110a are formed on sides of the gate electrode 104.

In addition, an N− type diffusion region 106 is formed in the photo diode region PD of the epitaxial layer 101. An N− diffusion region 108 for a lightly doped drain (LDD) structure and an N+ diffusion region 112 for source/drain diffusion regions are formed in the transistor region of the epitaxial layer 101.

A TEOS (Tetra-Ethyl-Ortho-Silicate) oxide 109 is formed over an entire surface of the semiconductor substrate 100 covering the gate electrode 104, and a metal silicide layer 115 is formed on a surface of the source/drain diffusion region 112. Furthermore, a nitride layer 116, functioning as a diffusion and etching blocker, and an interlevel dielectric layer 117 are formed in successive order over the entire surface of the semiconductor substrate 100.

FIGS. 3a to 3i are cross-sectional views illustrating a conventional method for manufacturing a CMOS image sensor.

Referring to FIG. 3a, a P− type epitaxial layer 101 is formed on the semiconductor substrate 100 such as single crystalline silicon having a heavy concentration and a first conductivity type (i.e., P++ type). Here, the epitaxial layer 101 functions to form a deep and wide depletion region in the photo diode region. Thereby, the ability of a low-voltage photo diode for gathering photoelectrons can be improved, and also the light sensitivity can be improved.

In addition, the semiconductor substrate 100 is defined by an active region and an isolation region, and an isolation layer 102 is formed by a shallow trench isolation (STI) process or a local oxidation of silicon (LOCOS) process.

Next, a gate insulating layer 103 and a conductive layer are deposited on the entire surface of the epitaxial layer 101 including the isolation layer 102, in successive order, and they are selectively patterned using photolithography and etching processes, thus forming the gate electrode 104.

A first photoresist layer is then applied over the entire surface of the substrate 100 including the gate electrode 104, and then it is patterned using exposure and development processes, thus forming a first photoresist pattern 105 exposing the photo diode region. Then, using the first photoresist pattern 105 as a mask, a N− diffusion region 106 is formed in the exposed photo diode region by ion-implantation of a low concentration of N type dopant ions.

As shown in FIG. 3b, after removing the first photoresist pattern 105, a second photoresist layer is applied over the entire surface of the substrate 100, and then it is patterned using exposure and development processes, thus forming a second photoresist pattern 107 exposing the transistor region. Then, using the second photoresist pattern 107 as a mask, a low concentration of N type dopant ions are implanted in the exposed transistor region to form a N− type diffusion region 108. Here, the N− type diffusion region 106 of the photo diode region is preferably formed at a diffusion depth greater than that of the N− type diffusion region 108 of the transistor region, using a higher implantation energy.

As shown in FIG. 3c, after removing the second photoresist pattern 107, a TEOS oxide layer 109 is formed over the entire surface of the substrate 100 in a thickness of about 200 Å, and then a nitride layer 110 is formed on the TEOS oxide layer 109. Continuously, an etch back process is performed on the nitride layer 110 to form the nitride sidewalls 110a on sides of the gate electrode 104, as shown in FIG. 3d.

As shown in FIG. 3e, a third photoresist layer is formed over the entire surface of the substrate 100, and then it is patterned by exposure and development processes, thus forming a third photoresist pattern 111 covering the photo diode region and the isolation layer 102. Continuously, using the third photoresist pattern 111 as a mask, a high concentration of N type dopant ions are implanted in source/drain regions to form the N+ type diffusion region 112.

As shown in FIG. 3f, after removing the third photoresist pattern 111, a heat-treatment process (e.g., a rapid thermal process under a temperature of over 800° C.) is performed to activate dopant ions in the N– type diffusion region 106, the N– type diffusion region 108, and the N+ type diffusion region 112. Next, a silicide blocking layer 113 is formed over the entire surface of the semiconductor substrate 100.

As shown in FIG. 3g, a fourth photoresist layer is applied on the silicide blocking layer 113, and it is patterned by exposure and development processes, thus forming a fourth photoresist pattern 114 exposing the region where a silicide will be formed. Using the fourth photoresist pattern 114 as a mask, the exposed silicide blocking layer 113 and the TEOS oxide layer 109 are selectively removed to expose a portion of the substrate where the N+ diffusion region 112 is formed.

As shown in FIG. 3h, after removing the fourth photoresist pattern 114, a metal layer having a high melting point is deposited and thermally treated to form a metal silicide layer 115 on the exposed surface of the substrate in the transistor region. Subsequently, a remaining metal material, not reacted with silicon, is removed, and the silicide blocking layer 113 is removed.

As shown in FIG. 3i, a nitride layer 116, functioning as a diffusion and etching blocker in the subsequent process(es), is deposited over the entire surface of the substrate 100, and an interlevel dielectric layer 117 is formed on the nitride layer 116. Afterward, power lines, color filter arrays, and microlenses are formed over the interlevel dielectric layer 117 to complete a CMOS image sensor, even though it is not shown in the drawings.

The conventional manufacturing method of a CMOS image sensor generally employs 0.35~0.18 micron technologies. Furthermore, sub-0.18 microns technologies have been intensively developed for a higher integration of semiconductor devices. In general, super-0.25 microns technologies have a thermal budget, which is caused by a silicidation process. More specifically, because a thermal treatment of over about 800° C. is rarely allowed after forming a silicide layer, it is difficult to remove impurities, which can cause dark currents.

Meanwhile, in the above-described conventional method, a heat treatment for a lightly doped drain structure and a photo diode and a heat treatment for source/drain diffusion regions can be also performed at a high temperature of over 800° C., thus enabling recovery or repair of the lattice-damaged substrate and activating implanted dopant ions. However, the interlevel dielectric layer 117 is required to be thermally treated at a temperature below 700° C. in order to prevent deformation of the metal silicide layer 115 and to form a shallow junction. The interlevel dielectric layer 117 is typically formed using a BPSG (Boron-Phosphorus-Silicate-Glass) material and has a gathering effect on impurities. The gathering effect of the interlevel dielectric layer 117 becomes powerful at a relatively high temperature. However, there is a limit to raise a heating temperature of the interlevel dielectric layer of a BPSG material, for the above-explained reason.

In addition, a diffusion blocker 116 (typically a nitride layer) is formed before forming the interlevel dielectric layer 117. However, as the size/area of the photo diode region decreases according to scale-down of a CMOS image sensor, the nitride layer 116 may cause reduction of dynamic range and light sensitivity of the CMOS image sensor. Thus, the performance qualities of the CMOS image sensor; such as reproducibility, etc., may deteriorate.

SUMMARY OF THE INVENTION

It is, therefore, an object of the present invention to provide a CMOS image sensor and a manufacturing method thereof, wherein a gathering layer effectively absorbs impurities during a high temperature heat-treatment, thus enabling reduction of dark currents.

To achieve the above object, an embodiment of a method for manufacturing a CMOS image sensor according to the present invention, comprises the steps of: forming an isolation layer on a semiconductor substrate, defining an active region including a photo diode region and a transistor region; forming a gate in the transistor region, the gate including a gate electrode and a gate insulating layer; forming a first low-concentration diffusion region in the photo diode region; forming a second low-concentration diffusion region in the transistor region; forming a buffer layer over an entire surface of the substrate, the buffer layer selectively removed to cover the photo diode region; forming first and second insulating layers over the entire surface of the substrate, the first and second insulating layers having a different etching selectivity from each other; forming an insulating sidewall on sides of the gate electrode by selective removal of the second insulating layer; selectively removing the first insulating layer on other regions than the photo diode region; forming a high-concentration diffusion region in the exposed transistor region, partially overlapping the second low-concentration diffusion region; and forming a metal silicide layer on a surface of the high-concentration diffusion.

In addition, a CMOS image sensor according to the present invention, comprises: an isolation layer on a semiconductor substrate, defining an active region including a photo diode region and a transistor region; a gate on the transistor region, including a gate electrode and a gate insulating layer; a first low-concentration diffusion region in the photo diode region of the substrate; a second low-concentration diffusion region and a high-concentration diffusion region in the transistor region of the substrate, partially overlapping with each other; a buffer layer covering the photo diode region, an insulating sidewall on sides of the gate electrode; and a metal silicide selectively formed on a surface of the high-concentration diffusion region. Here, the buffer layer can extend from the photo diode region to a top portion of the gate.

These and other aspects of the invention will become evident by reference to the following description of the invention, often referring to the accompanying drawings.

DETAILED DESCRIPTION OF THE INVENTION

Hereinafter, a preferred embodiment of a method for manufacturing a CMOS image sensor according to the present invention will be described referring to the accompanying drawings.

FIGS. 4a to 4j are cross-sectional views illustrating a preferred embodiment of a method for manufacturing a CMOS image sensor according to the present invention.

Figure 1:
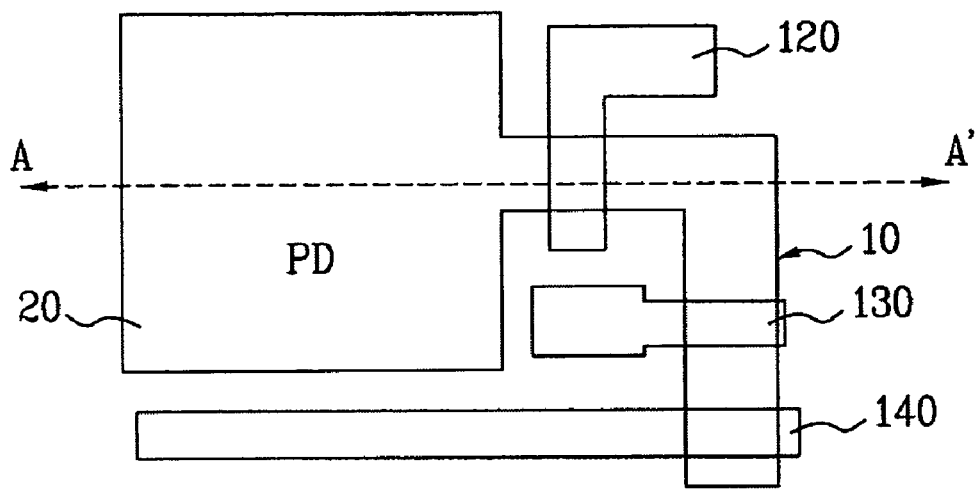
FIG. 1 is a layout illustrating unit pixel in a conventional 3T type CMOS image sensor.
Figure 2:
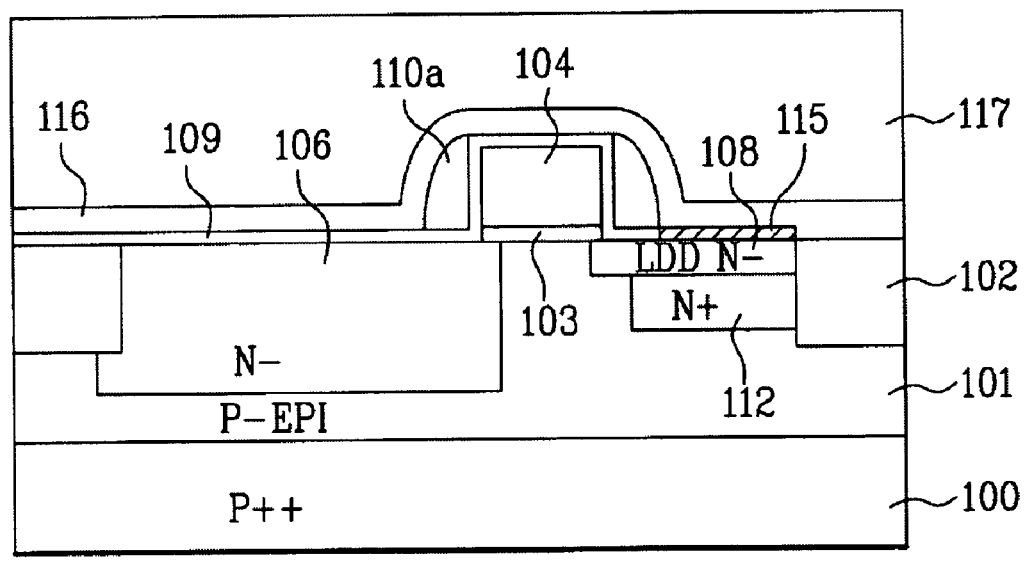
FIG. 2 is a cross-sectional view illustrating a photo diode and a reset transistor of a conventional CMOS image sensor, in view of A-A' line in FIG. 1.
Figure 3A:
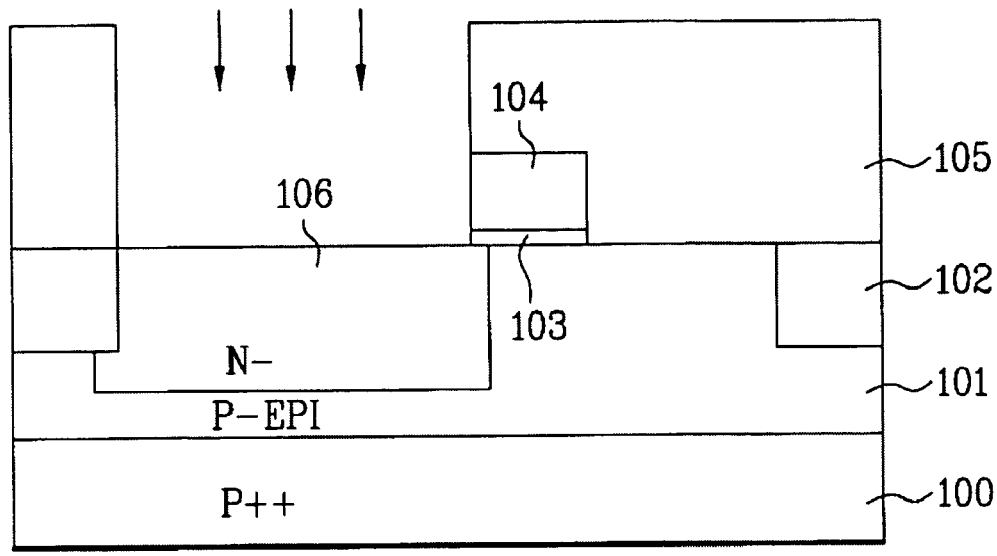
FIGS. 3a to 3i are cross-sectional views illustrating a conventional method for manufacturing a CMOS image sensor.
Figure 3B:
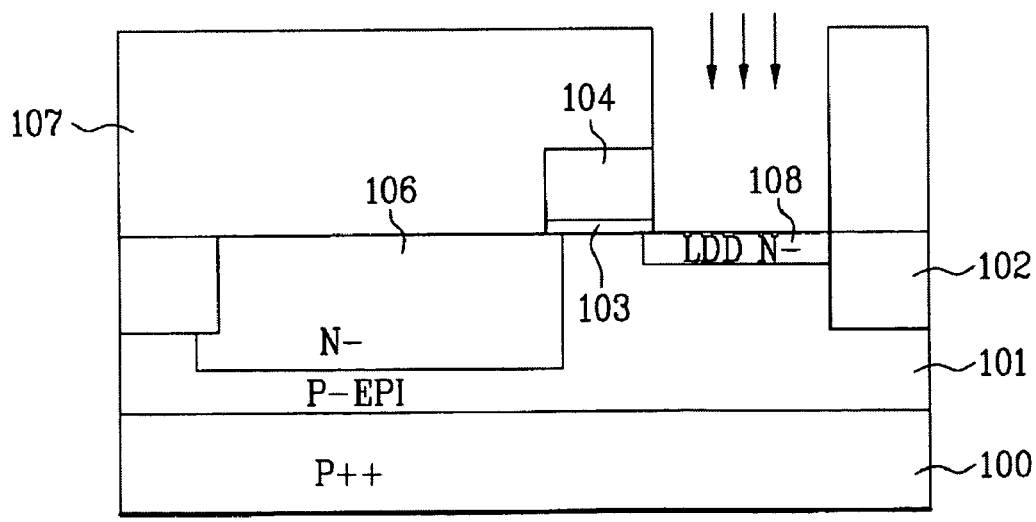
Figure 3C:
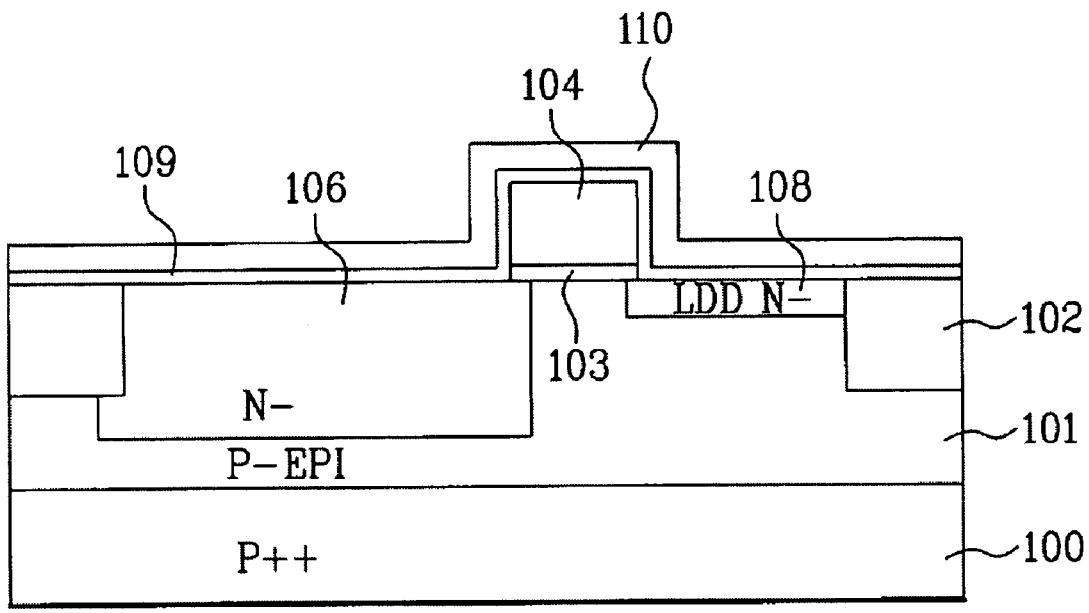
Figure 3D:
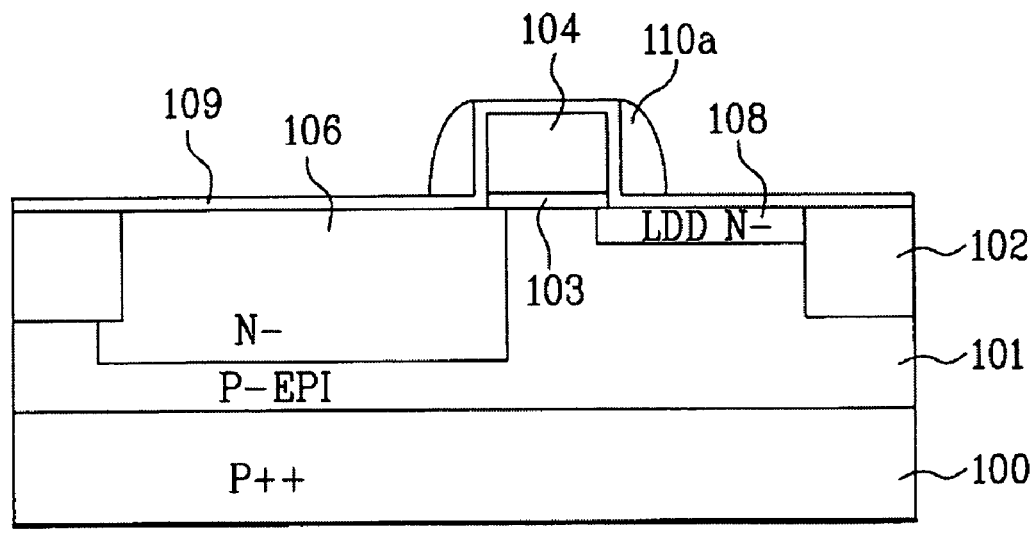
Figure 3E:
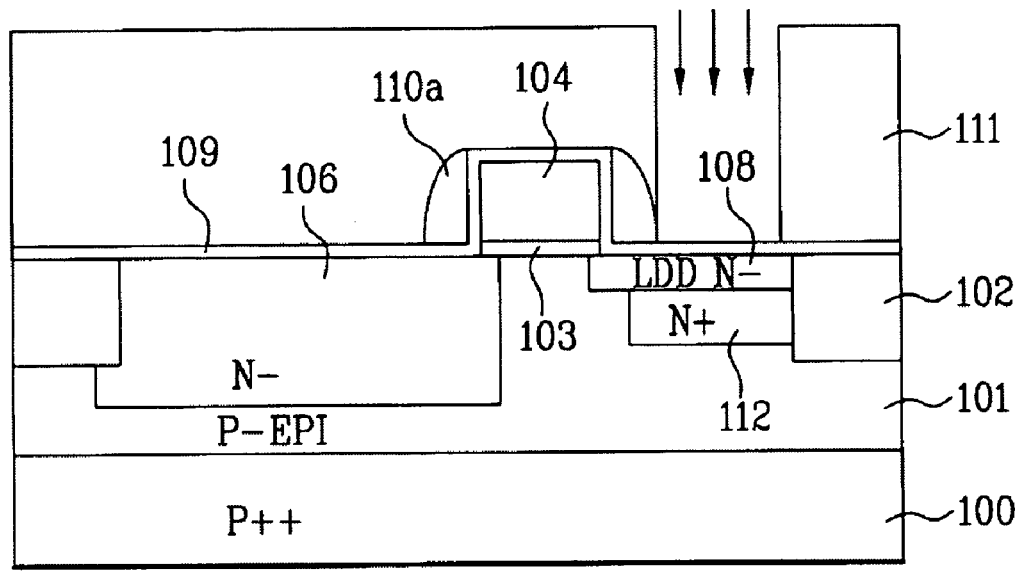
Figure 3F:
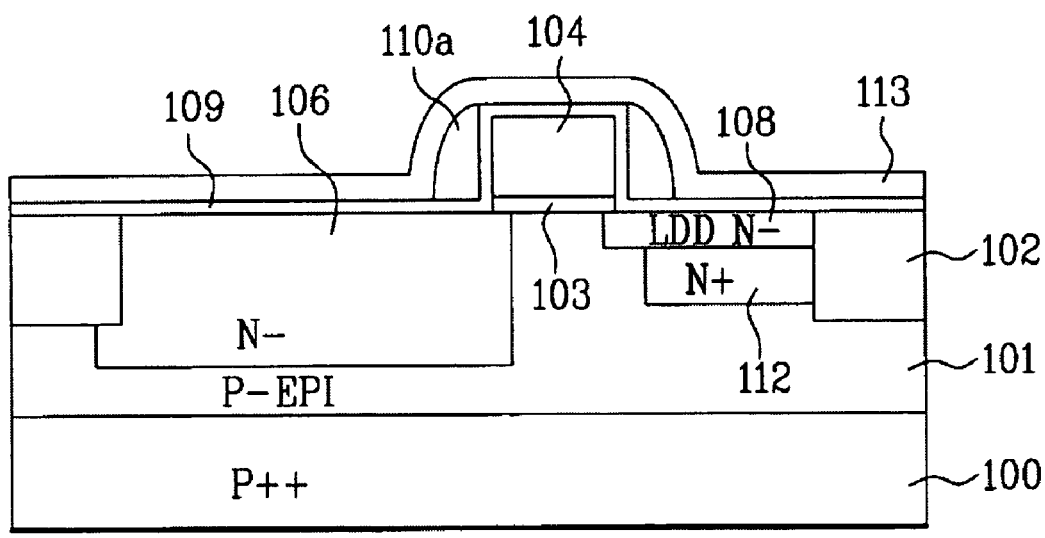
Figure 3G:
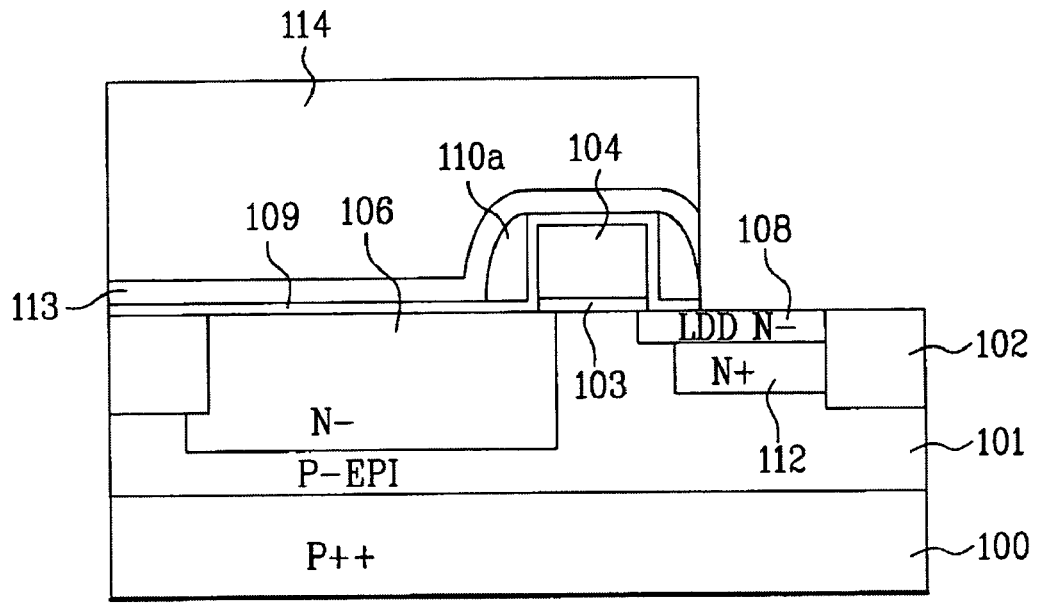
Figure 3H:
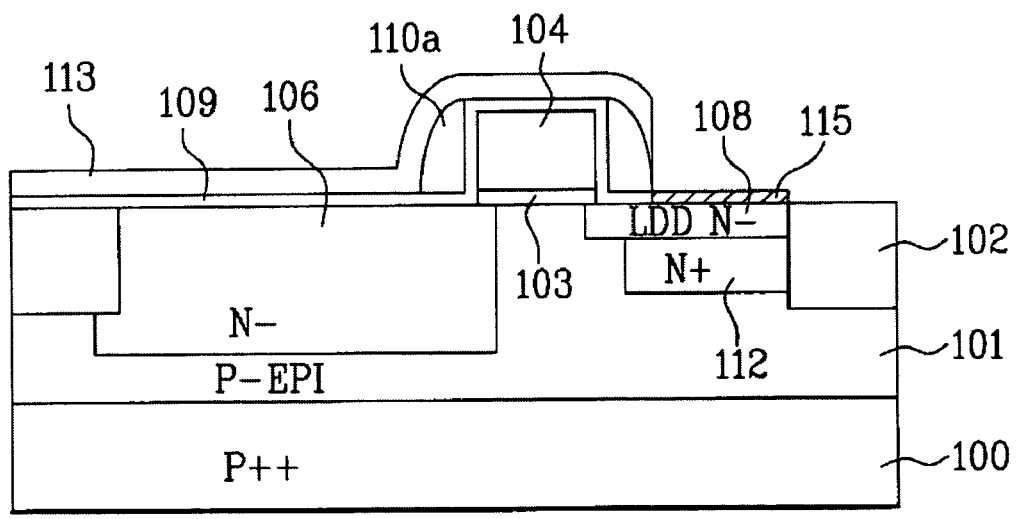
Figure 3I:
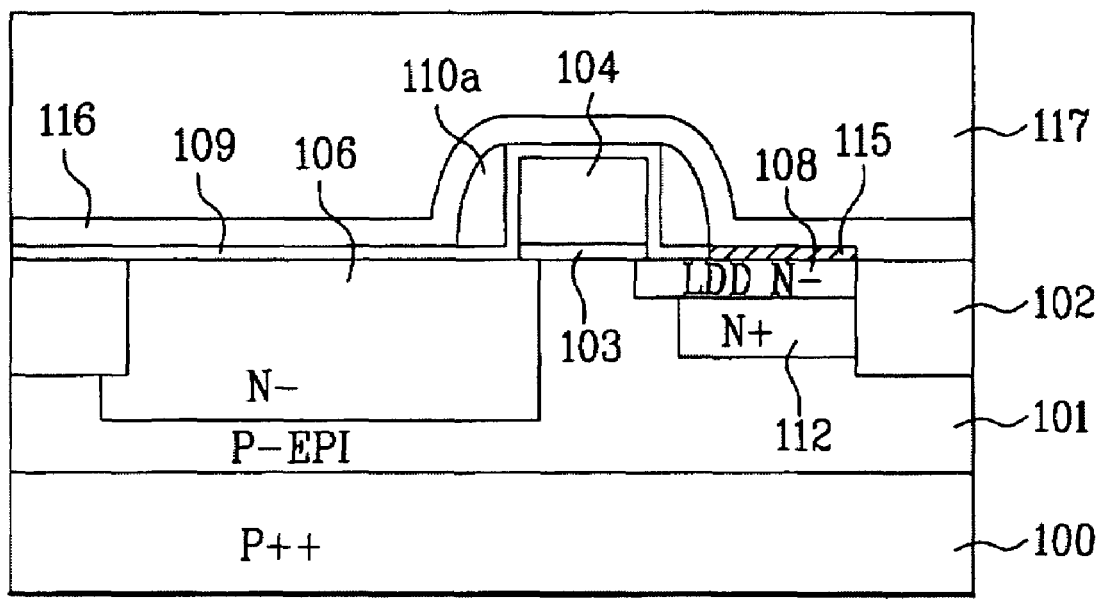
Figure 4A:
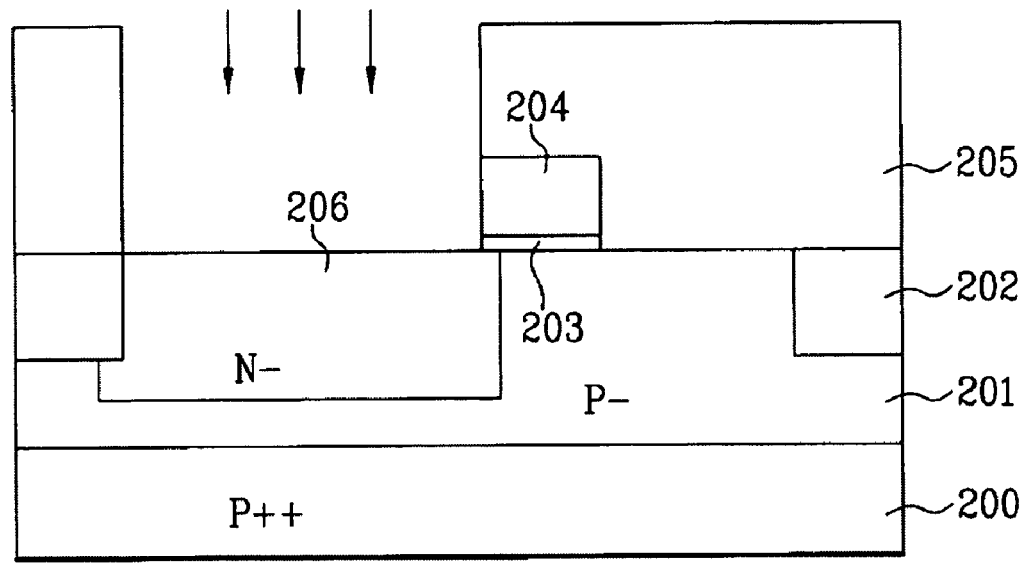
FIGS. 4a to 4j are cross-sectional views illustrating a preferred embodiment of a method for manufacturing a CMOS image sensor according to the present invention.

Referring to FIG. 4a, an epitaxial layer 201 having a low concentration and a first conductivity type (i.e., P+ type) is formed on a semiconductor substrate 200 such as single crystalline silicon having a heavy concentration and the first conductivity type (i.e., P++ type).

Here, the epitaxial layer 201 functions to form a deep and wide depletion region in or for a photo diode. Thereby, the ability of a low-voltage photo diode for gathering photoelectrons can be improved, and also the light sensitivity can be improved.

In addition, the semiconductor substrate 200 is defined into an active region (which includes a photo diode region and a transistor region) and an isolation region. An isolation layer 202 may be formed in the isolation region by a shallow trench isolation (STI) process or a local oxidation of silicon (LOCOS) process.

Next, a gate insulating layer 203 and a conductive layer (e.g., a heavily doped polysilicon layer) are deposited on an entire surface of the epitaxial layer 201, including the isolation layer 202, in successive order, and they are selectively patterned using photolithography and etching processes, thus forming the gate electrode 204. Here, the gate insulating layer 203 can be formed using a thermal oxidation process or chemical vapor deposition process, and a silicide layer can be formed on the gate electrode by a conventional salicidation process. Moreover, an additional thermal oxidation process can be performed to form thermal oxide layers (not shown) on surfaces of the gate electrode 204 and the semiconductor substrate 200, respectively. Especially, a width of the gate electrode 204 can be greater than that of the conventional gate electrode, considering a thickness of the thermal oxide layer formed on the peripheral surfaces thereof (which consumes some surface portion of the gate electrode 204, resulting in a gate having an effective width less than that of the patterned gate 204).

A first photoresist layer is applied over the entire surface of the substrate 200 including the gate electrode 204, and then it is patterned using exposure and development processes, thus forming a first photoresist pattern 205 exposing the photo diode region. Then, using the first photoresist pattern 205 as a mask, a N− diffusion region 206 is formed in the exposed photo diode region by ion-implantation of a low concentration of second conductivity type dopant ions (e.g., N type dopant ions).

Figure 4B:
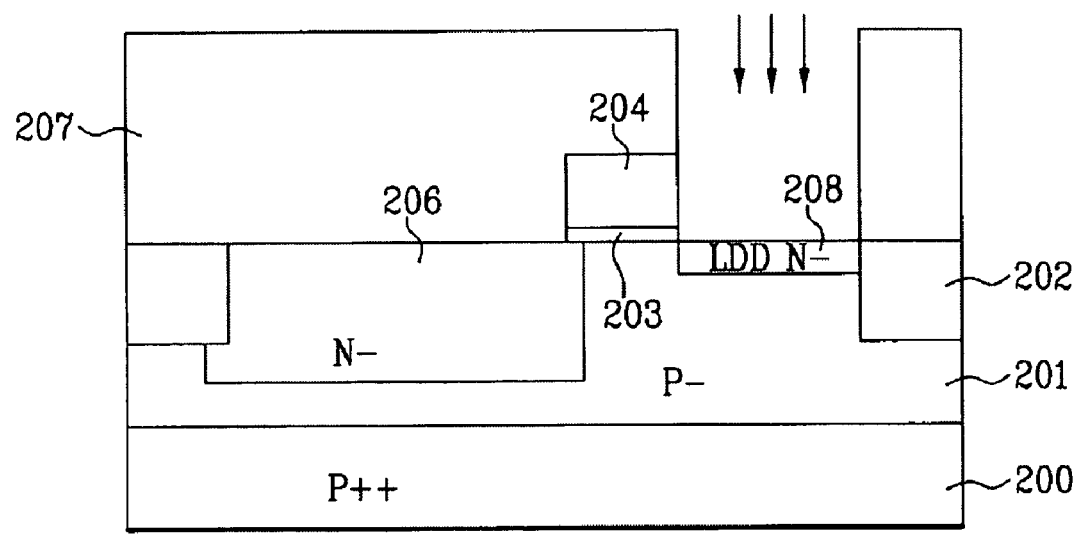

As shown in FIG. 4b, after removing the first photoresist pattern 205, a second photoresist layer is applied over the entire surface of the substrate 200, and then it is patterned using exposure and development processes, thus forming a second photoresist pattern 207 exposing the transistor region. Then, using the second photoresist pattern 207 as a mask, a low concentration of second (e.g., N) type dopant ions are implanted in the exposed transistor region to form a diffusion region 208 for a lightly doped drain structure. Here, the N− type diffusion region 206 of the photo diode region preferably has a depth greater than that of the N− type diffusion region 208 of the transistor region. For example, a greater depth for one diffusion region relative to another containing the same dopant may be formed using a higher implantation energy.

Figure 4C:
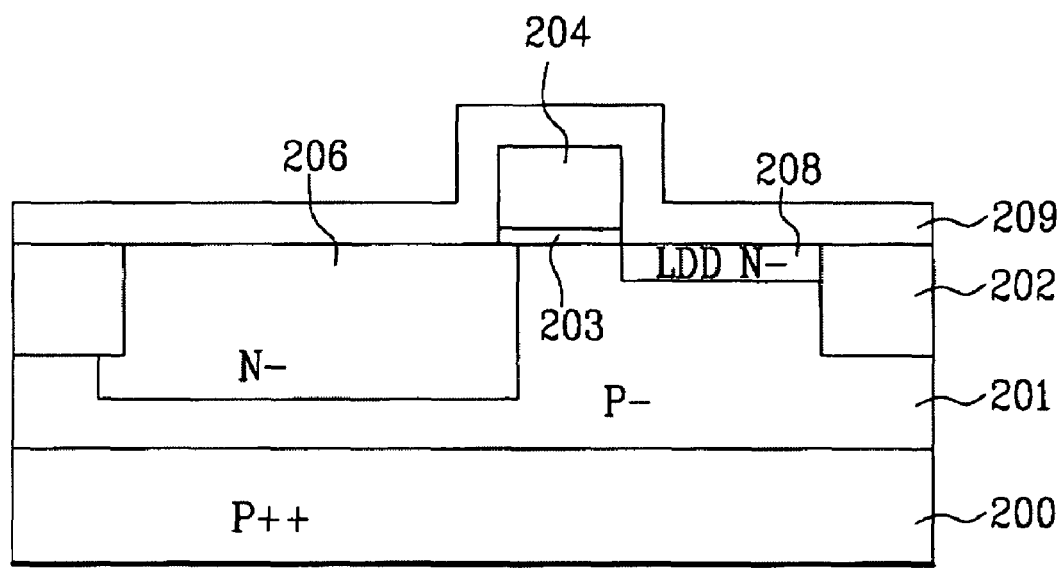

As shown in FIG. 4c, after removing the second photoresist pattern 207, a buffer layer 209 is formed on the entire surface of the substrate 200 by a low-pressure chemical vapor deposition process using an $O_3$-TEOS or BPSG material. Thus, the buffer layer 209 may comprise an oxide layer (e.g., silicon dioxide), which can be further doped with a conventional dopant for glass, such as boron and/or phosphorous, fluorine, carbon, etc. The buffer layer 209 is preferably formed to a thickness of 400 Å ~3000 Å, considering an over-etch margin for a diffusion blocking nitride layer that will be formed in the subsequent process. In addition, the buffer layer 209 functions as a blocking layer to damage of the substrate during the formation of the subsequent nitride sidewall, and as a gathering layer on or for impurities. Namely, the buffer layer 209 can absorb impurities generated during the subsequent heat-treatment process, thus enabling conspicuous reductions in adverse effects of the impurities to the substrate. As a result, dark currents of a CMOS image sensor can be effectively decreased or prevented.

Figure 4D:
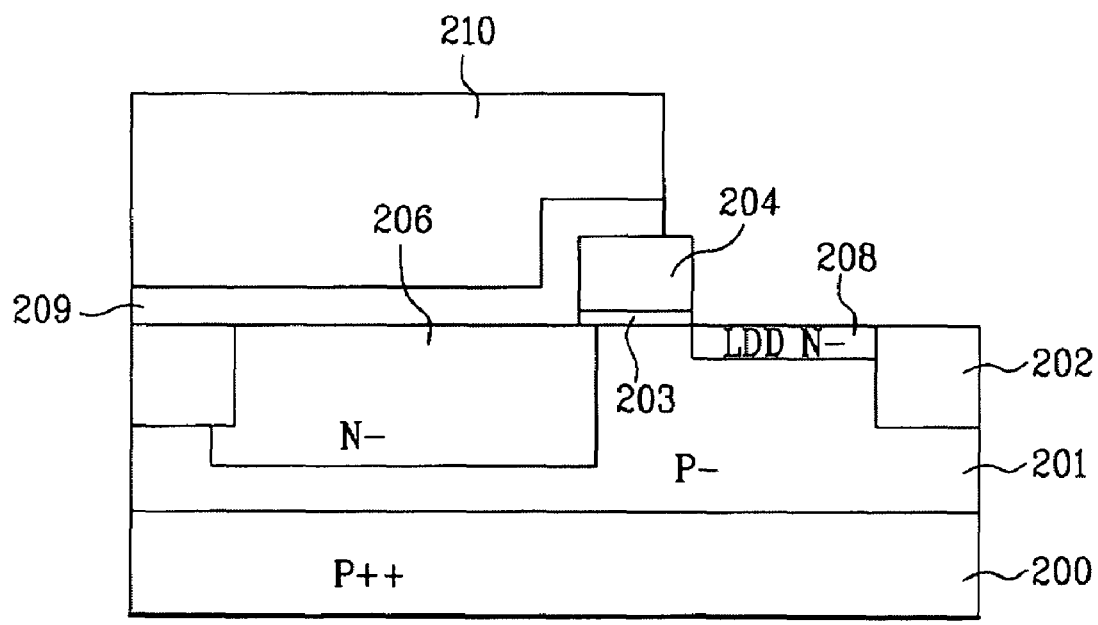

As shown in FIG. 4d, a third photoresist layer is applied on the buffer layer 209, and then it is selectively patterned to form a third photoresist pattern 210 remaining over the photo diode region. Next, using the third photoresist pattern 210 as a mask, the buffer layer 209 is selectively removed. Here, an etching gas for the buffer layer 209 can comprise a silane gas (e.g., $SiH_4$) or other conventional oxide etchant.

Figure 4E:
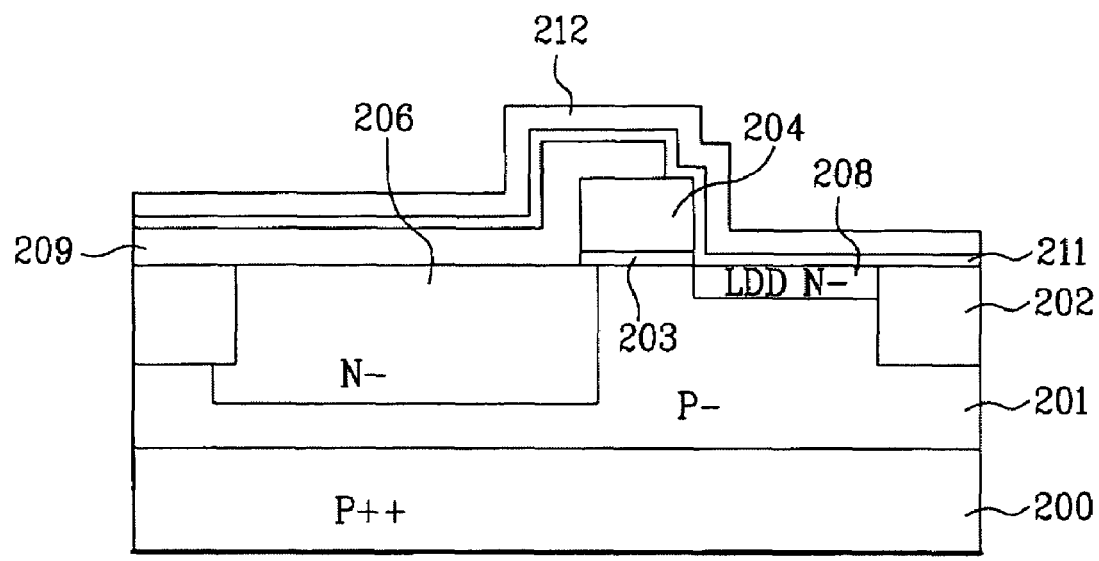

As shown in FIG. 4e, after removing the third photoresist pattern 210, a first insulating layer 211 and a second insulating layer 212 are formed in successive order over the entire surface of the substrate 200, for example using a chemical vapor deposition (CVD) process (especially, a low-pressure CVD process). The first and second insulating layers 211 and 212 have a different etching selectivity from each other.

Here, the first insulating layer 211 preferably comprises an oxide layer that may have a thickness of about 200 Å, and the second insulating layer 212 preferably comprises a nitride layer. The second insulating layer 212 may have a thickness of from 500 to 1500 Å, e.g., 700 to 1300 Å. Moreover, the first insulating oxide layer can comprise a thermal oxide layer or a TEOS-based oxide.

Figure 4F:
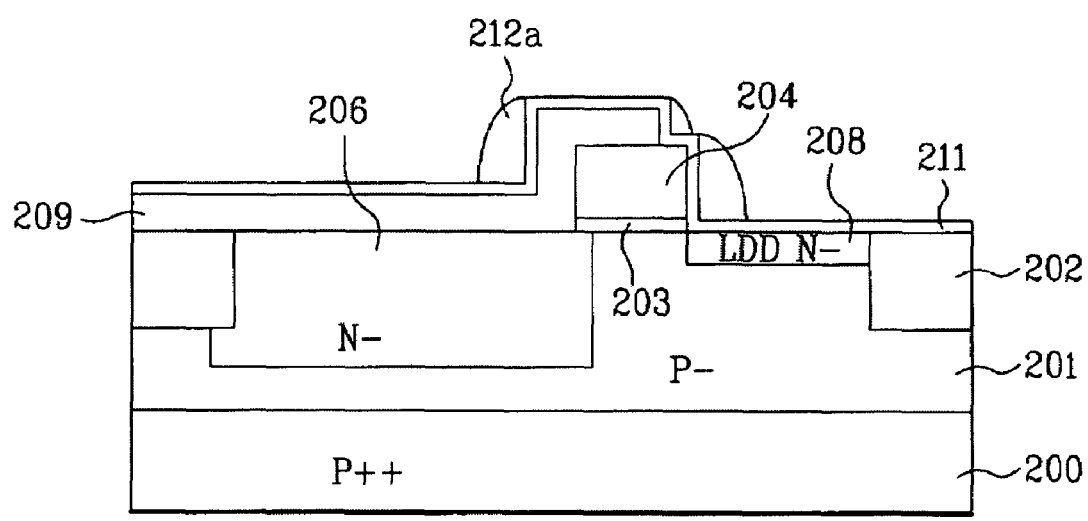

As shown in FIG. 4f, an etch back process (e.g., anisotropic etching) is performed on the second insulating layer 212, utilizing the etching selectivity of the first and second insulating layers 211 and 212, thus forming second insulating sidewalls 212a on sides of the gate electrode 204. For example, the etch rate of the second insulating layer 212 relative to the etch rate of the first insulating layer 211 under the etch conditions employed may be ≧10:1, 20:1 or 50:1. In such case, the first insulating layer 211 below the second insulating layer 212 remains substantially unetched.

Figure 4G:
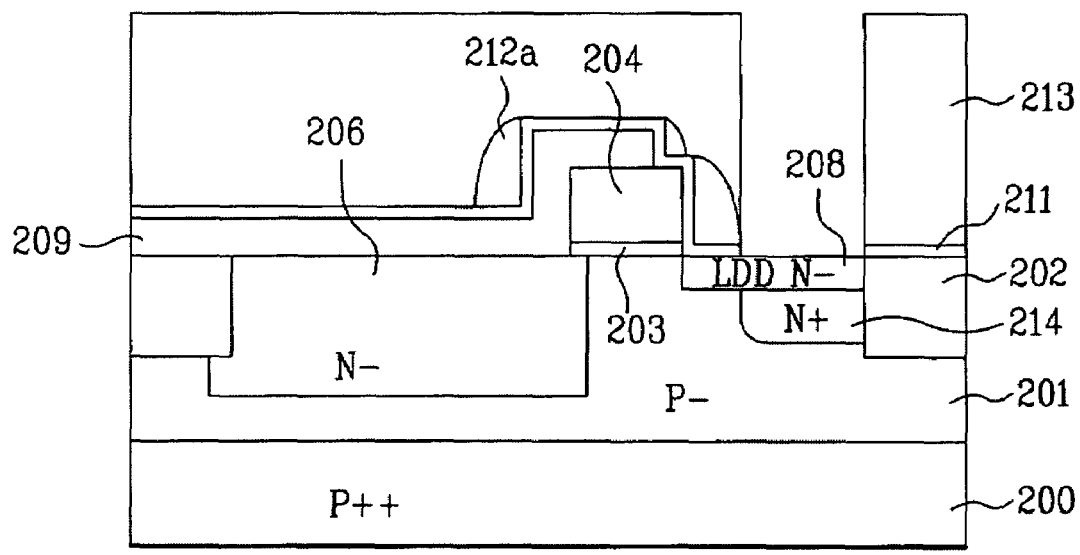

As shown in FIG. 4g, a fourth photoresist layer is formed over the entire surface of the substrate 200, and then it is patterned by exposure and development processes, thus forming a fourth photoresist pattern 213 covering the photo diode region and the isolation layer 202. Next, using the fourth photoresist pattern 213 as a mask, the exposed portion of the first insulating layer 211 is selectively removed.

Next, a high concentration of the second (e.g., N) type dopant ions is implanted in the transistor region of the substrate 200 to form an N+ type diffusion region 214.

Figure 4H:
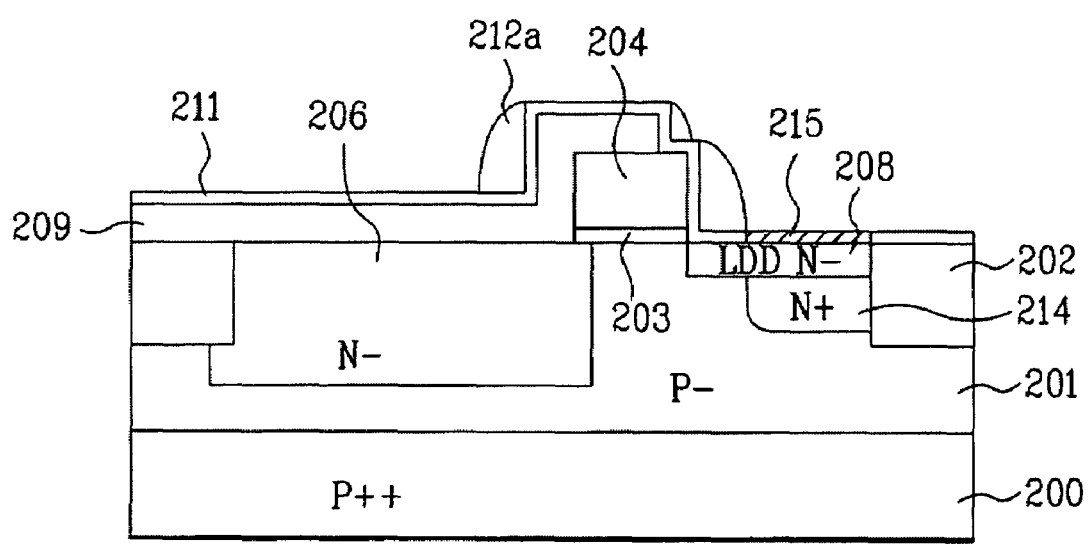

As shown in FIG. 4h, after removing the fourth photoresist pattern 213, a heat-treatment process (e.g., a rapid thermal process) is performed at a temperature of 800° C.~1200° C. to activate dopant ions in the first N− type diffusion region 206, the second N− type diffusion region 208, and the N+ type diffusion region 214. In this process, the buffer layer 209 can be used as a gathering layer on (or getterer for) impurities. Especially, the heat-treatment can be performed in two steps: one is a first heat-treatment after forming the first N− type diffusion region 206 and the second N− type diffusion region 208, and the other is a second heat-treatment after forming the N+ type diffusion region. Here, in the first heat-treatment after forming the first N− type diffusion region 206 and the second N− type diffusion region 208, an oxide layer (not shown) is preferably formed (e.g., by thermal oxidation) to a thickness of, e.g., 20 Å ~100 Å on the exposed portion of the gate electrode 204, generally following removal of the buffer layer 209 as shown in FIG. 4d. Next, a metal layer having a high melting point is deposited and thermally treated (e.g., heated) to form a metal silicide layer 215 on the exposed surface of the substrate in the transistor region.

Figure 4I:
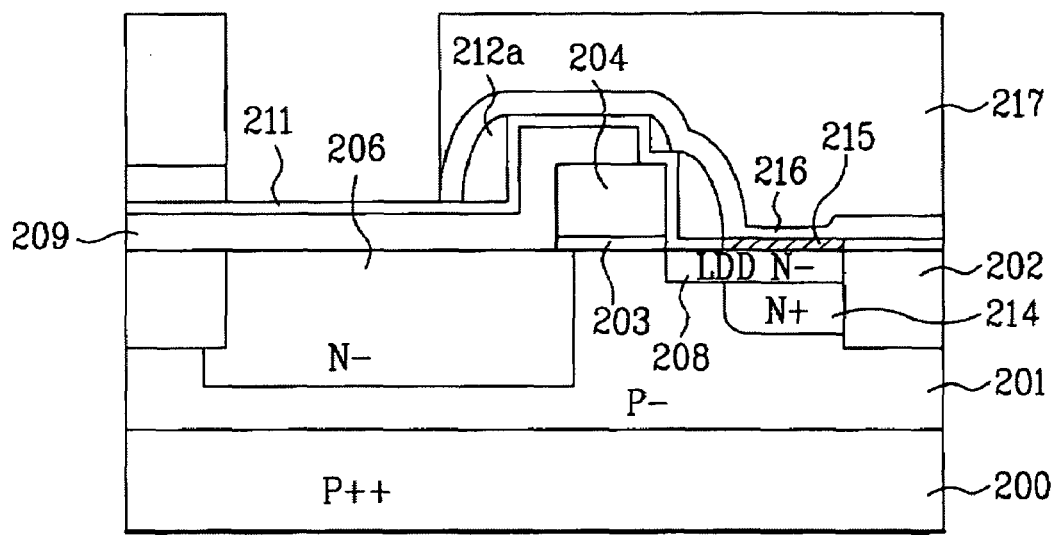

As shown in FIG. 4i, a nitride layer 216, functioning as a diffusion and etching blocker in the subsequent process(es), is deposited over the entire surface of the substrate 200. After that, a fifth photoresist layer is applied on the nitride layer 216, and it is patterned by exposure and development processes to form a fifth photoresist pattern 217 exposing part or all of the photo diode region. Subsequently, using the fifth photoresist pattern 217 as a mask, the nitride layer 216 on the photo diode region is selectively removed.

Figure 4J:
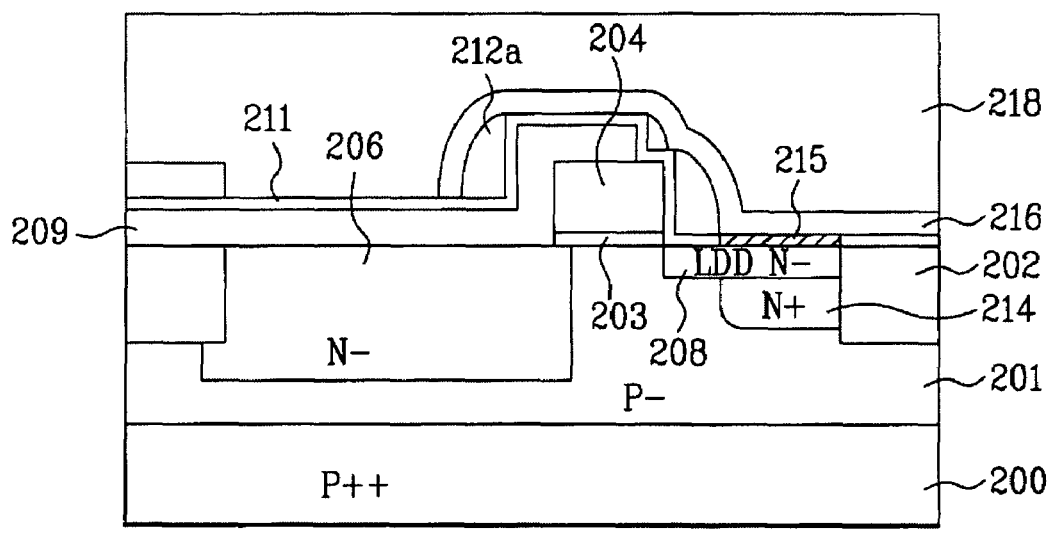

As shown in FIG. 4j, after removing the fifth photoresist pattern 217, an interlevel dielectric layer 218 is formed over the entire surface of the substrate 200. Here, the interlevel dielectric layer 218 can comprise a silane based dielectric material (e.g., a so-called "plasma silane" oxide, or undoped silica glass [p-USG]), of which a large amount of hydrogen ions can recover or occupy dangling bonds of the substrate 200, thus resulting in an effective reduction in dark current.

The above-described method for manufacturing a CMOS image sensor according to the present invention has advantages as follows.

First, a gathering or gettering layer (e.g., an oxide-based buffer layer) enables effective reduction of impurities during high temperature heat-treatment, thus resulting in reduction of dark currents. Second, the buffer layer can reduce or prevent damage to the substrate, which may occur during formation of the insulating sidewalls, thus further contributing to resultant reduction in dark current. Third, in a heat-treatment process (e.g., at a temperature of 800° C.~1200° C., typical for activating dopant in a LDD structure and a photo diode), an additional thermal oxide layer can be formed on an exposed surface of a gate electrode following a selective removal of the buffer layer. The additional thermal oxidation layer can repair damage to the gate electrode, thus enabling improvement in the reliability of the thus-formed devices. Consequently, the present invention can reduce dark current and improve reproducibility and resolution of a CMOS image sensor.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for manufacturing a CMOS image sensor, comprising the steps of:

forming an isolation layer on a semiconductor substrate, the isolation layer defining an active region including a photo diode region and a transistor region;

forming a gate in the transistor region, the gate including a gate insulating layer and a gate electrode thereon;

forming a first low-concentration diffusion region in the photo diode region;

forming a second low-concentration diffusion region in the transistor region;

forming a buffer layer over the substrate, the buffer layer having an opening exposing the transistor region;

forming first and second insulating layers over an entire surface of the substrate, including on the buffer layer in the photo diode region, the first and second insulating layers having a different etching selectivity from each other;

forming an insulating sidewall on sides of the gate electrode by selective removal of the second insulating layer, including on the first insulating layer in the transistor region and the photo diode region, and on the buffer layer in the photo diode region;

selectively removing the first insulating layer to expose the transistor region;

forming a high-concentration diffusion region in the exposed transistor region, partially overlapping the second low-concentration diffusion region; and forming a metal silicide layer on a surface of the high-concentration diffusion region.

2. The method of claim 1, wherein the first insulating layer comprises an oxide.

3. The method of claim 1, wherein the second insulating layer comprises a nitride.

4. The method of claim 2, wherein the first insulating layer comprises a thermal oxide layer or a TEOS-based oxide layer.

5. The method of claim 1, wherein the buffer layer comprises $O_3$-TEOS or BPSG.

6. The method of claim 1, wherein selectively removing the buffer layer comprises etching with an etchant comprising a silane gas.

7. The method of claim 1, further comprising the step of heat-treating the substrate after forming the first and second low-concentration diffusion regions.

8. The method of claim 7, further comprising the step of heat-treating the substrate after forming the high-concentration diffusion region.

9. The method of claim 8, wherein the first and second heat-treatments are performed at a temperature of 800° C.~1200° C.

10. The method of claim 1, further comprising the steps of:

forming a diffusion and/or etching blocker over the entire surface of the substrate, after forming the metal silicide layer; and selectively removing the diffusion and/or etching blocker over the photo diode region.

11. The method of claim 10, further comprising the step of forming a dielectric layer over the entire surface of the substrate including the remaining diffusion and/or etching blocker.

12. The method of claim 10, wherein the diffusion and/or etching blocker comprises a nitride layer.

13. The method of claim 11, wherein the dielectric layer comprises a silane-based insulating material.

14. The method of claim 1, wherein the buffer layer has a thickness of 400 Å~3000 Å.

* * * * *